United States Patent
Raphaeli

(10) Patent No.: US 7,443,326 B2
(45) Date of Patent: Oct. 28, 2008

(54) DIGITAL INPUT SIGNALS CONSTRUCTOR PROVIDING ANALOG REPRESENTATION THEREOF

(76) Inventor: Dan Raphaeli, Halamed Hei 19, Kfar Saba (IL) 44394

( * ) Notice: Subject to any disclaimer, the term of this patent is extended or adjusted under 35 U.S.C. 154(b) by 0 days.

(21) Appl. No.: 10/577,055

(22) PCT Filed: Oct. 25, 2004

(86) PCT No.: PCT/IL2004/000969

§ 371 (c)(1),
(2), (4) Date: Apr. 24, 2006

(87) PCT Pub. No.: WO2005/041417

PCT Pub. Date: May 6, 2005

(65) Prior Publication Data

US 2007/0080841 A1 Apr. 12, 2007

Related U.S. Application Data

(60) Provisional application No. 60/514,003, filed on Oct. 27, 2003.

(51) Int. Cl.
*H03M 1/66* (2006.01)

(52) U.S. Cl. .................. 341/144; 341/145; 341/156
(58) Field of Classification Search ................ 341/108, 341/144, 145, 156; 356/464
See application file for complete search history.

(56) References Cited

U.S. PATENT DOCUMENTS

| | | | | |
|---|---|---|---|---|
| 3,541,319 | A * | 11/1970 | James | 708/823 |
| 4,968,989 | A * | 11/1990 | Olmstead et al. | 341/150 |
| 5,007,016 | A | 4/1991 | Le Mehaute et al. | |
| 5,123,741 | A * | 6/1992 | Spahlinger | 356/464 |
| 5,345,234 | A * | 9/1994 | Stewart et al. | 341/108 |
| 5,554,986 | A * | 9/1996 | Neidorff | 341/145 |
| 5,579,004 | A * | 11/1996 | Linz | 341/144 |
| 5,920,478 | A | 7/1999 | Ekblad et al. | |
| 6,115,537 | A | 9/2000 | Yamada et al. | |
| 6,498,575 | B2 * | 12/2002 | Matsusaka | 341/144 |
| 6,628,221 | B2 * | 9/2003 | Jin | 341/152 |
| 6,806,756 | B1 | 10/2004 | Manlove et al. | |
| 2004/0051657 | A1 * | 3/2004 | Jonsson et al. | 341/156 |

* cited by examiner

*Primary Examiner*—Jean B Jeanglaude

(57) ABSTRACT

A digital to analog waveform converter featuring a DSP, discrete output devices, and Multi Input Multi Output (MIMO) device, wherein the MIMO device includes low accuracy components featuring high speed and low power.

47 Claims, 6 Drawing Sheets

DIGITAL INPUT SIGNALS CONSTRUCTOR PROVIDING ANALOG REPRESENTATION THEREOF

CROSS-RELATED APPLICATIONS

This application claims the benefit of PCT/IL04/00969 filed on Oct. 25, 2004, which claims the benefit of U.S. provisional patent application 60/514,003 filed on Oct. 27, 2003.

FIELD AND BACKGROUND OF THE INVENTION

The present invention relates to digital input signals construction and, more particularly, to method and corresponding device for constructing at least one digital input signal and providing analog representation thereof, featuring a DSP, discrete output devices, and Multi Input Multi Output (MIMO) system. The MIMO system of the present invention, constructed from low accuracy components featuring high speed and low power, outputs a constructed analog signal equivalent to the digital input signal representation.

The present invention is primarily directed to applications requiring high bandwidth with low current consumption, including but not limited to applications featuring digital signal processing including analog signal outputs, in a variety of applications such as radar, imaging and analog front-end of a wireless modem.

The inputs to a previous art digital input signals constructor providing analog representation thereof are digital signal(s) and a clock or any other deterministic signal or signals. Previous art digital signal constructor providing analog representation thereof is a system containing linear components, non-linear components, amplifiers, and optionally, delay elements and decision elements that output constructed analog signal as function of its input bits. The previous art digital input signals constructor providing accurate conversion of each digital input signal representation to its constructed equivalent analog signal. Occasionally, the previous art digital input signals constructor providing equivalent analog signal is calibrated in order to compensate for the inaccuracy of its components. The calibrationis done by changing the previous art constructor. More specifically, the gains and offsets of the previous art constructor are modified in order to achieve constructed analog signal equivalent to the digital input signals representation, featuring better accuracy.

SUMMARY OF THE INVENTION

The present invention relates to digital input signals construction and, more particularly, to method and corresponding device for constructing at least one digital signal and providing analog representation thereof, featuring a DSP, discrete output devices, and Multi Input Multi Output (MIMO) system, wherein the MIMO system is constructed from low accuracy components featuring high bandwidth, high gain, and low current consumption.

In contrary to the previous art digital input signals constructors providing analog representation thereof, the constructor disclosed in the present invention is not calibrated in order to compensate for the inaccuracy of its components. More specifically, the gains and offsets of the constructor disclosed in the present invention are not modified in order to achieve digital input signals constructor, providing analog representation of the digital input signals, featuring better accuracy.

Implementation of the method and corresponding device of the present invention involves performing or completing selected functions and/or tasks and/or steps and/or operations manually, semi-automatically, fully automatically, and/or, a combination thereof. Moreover, according to actual instrumentation and/or equipment used for implementing a particular preferred embodiment of the disclosed method and corresponding device, several selected functions and/or tasks and/ or steps and/or operations of the present invention could be performed by hardware, by software on any operating system of any firmware, or a combination thereof. In particular, as hardware, selected functions and/or tasks and/or steps and/or operations of the invention could be performed by a computerized network, a computer, a computer chip, an electronic circuit, hard-wired circuitry, or a combination thereof, involving a plurality of digital and/or analog, electrical and/or electronic, components, operations, and protocols. Additionally, or alternatively, as software, selected functions and/or tasks and/or steps and/or operations of the invention could be performed by a data processor, such as a computing platform, executing a plurality of computer program types of software instructions or protocols using any suitable computer operating system.

Thus, according to the present invention, there is provided a method and a corresponding system for constructing at least one digital input signal and providing at least one analog representation signal thereof including the steps of: (a) feeding a DSP with the at least one digital input signal and a synchronization clock, (b) repeatedly identifying a model of a constructing device for creating a representation of the relationships between the DSP digital outputs and at least one of the at least one analog representation signal of the constructing device, wherein the constructing device comprising discrete output devices and a MIMO system, (c) the DSP is calculating n digital outputs, by using the at least one digital input signal and the identified model of the constructing device, (d) the n digital outputs are received by k discrete output devices comprising, in total, n digital inputs, m analog outputs, and simple conversion rules between then digital inputs and the m analog outputs, (e) the MIMO system receiving the m analog outputs, and providing at least one output analog signal equivalent to the al least one digital input signal.

According to still further features in the described preferred embodiments, the MIMO system constructed from low accuracy components featuring high bandwidth, high gain, and low current consumption.

According to still further features in the described preferred embodiments, the model incorporates and compensated for most of the noise created by the digital input signals constructor of the present invention, contaminating the digital input signal or the intermediate signals.

According to still further features in the described preferred embodiments, the model incorporates and compensated for clock skew.

According to still further features in the described preferred embodiments, the MIMO system is time varying according to the synchronization clock.

According to still further features in the described preferred embodiments, identifying comprising identify the inverse relation.

According to still further features in the described preferred embodiments, identifying a model comprising feeding at least one known digital signal to the at least one digital input signal in a training period, and reading the known digital signal and digital result from at least one ADC connected to the at least one analog representation signal, and identifying the model of the constructing device by applying a system identification algorithm.

According to still further features in the described preferred embodiments, the at least one known digital signal comprising a sequence of independently and identically uniformly distributed pseudo-random numbers.

According to still further features in the described preferred embodiments, the model is identified by applying an identification algorithm that is using an a-priori statistical knowledge.

According to still further features in the described preferred embodiments, the constructing device is enclosed in a system performing several signal processing functions which contains information regarding the at least one analog representation signal, and the information is sufficient for enabling an identification algorithm of the model constructing device.

According to still further features in the described preferred embodiments, an additional signal constructor comprising a system model with unknown parameters is used for identifying the model of a constructing device, and unknown parameters of both models are identified by joint model identification algorithm.

According to still further features in the described preferred embodiments, the joint model identification algorithm is based on feeding the constructing device with at least one known training sequence.

According to still further features in the described preferred embodiments, the at least one known training sequence comprising an independently and identically distributed pseudo-random sequence.

According to still further features in the described preferred embodiments, identifying a model comprising low speed components sampling the at least one analog representation signal every few samples and training only on the sampled samples.

According to still further features in the described preferred embodiments, identifying a model comprising a low speed DAC reference, wherein a training digital signal is fed both to the low speed DAC reference and to the constructing device, and the analog output signals of low speed DAC reference and the at least one analog representation signal are subtracted in order to create an error signal; the error signal is sampled and fed to the DSP for training.

According to still further features in the described preferred embodiments, the discrete output devices comprising at least one low resolution digital to analog converter.

According to still further features in the described preferred embodiments, the value of each of the m analog outputs is selected from a predefined group of values.

According to still further features in the described preferred embodiments, the m analog outputs are time varying according to a predetermined waveform.

According to still further features in the described preferred embodiments, the MIMO system is selected from the group consisting of continuous MIMO system, and MIMO system having a unified model, and continuous MIMO system having a unified model.

According to still further features in the described preferred embodiments, the calculating n digital outputs is by inverting the model by using internal controller in order to keep the error to be within a deterministic or probabilistic set of predefined constraints and internal constructing device for implementing, in the digital domain, the mathematical equivalence of the transfer function of the constructing device.

According to still further features in the described preferred embodiments, the MIMO system is a linear MIMO system.

According to still further features in the described preferred embodiments, the constructing at least one digital input signal and providing at least one analog representation signal thereof including the steps of: (a) at least one additional DSP, k discrete output devices, and MIMO system having a model, being fed by the at least one digital input signal and the synchronization clock, (b) identifying the model of the MIMO system and the additional MIMO system by applying joint model identification algorithm.

According to still further features in the described preferred embodiments, the at least one digital input signal providing at least one analog representation signal thereof is implemented as a multi-stage configuration.

According to still further features in the described preferred embodiments, the at least one digital input signal providing at least one analog representation signal thereof is implemented as a multi-stage configuration and the multi-stage configuration comprising an iterative control; the iterative control is transferring a residual error to subsequent stages in each stage where the control function is successfully implemented According to still further features in the described preferred embodiments, the at least one digital input signal providing at least one analog representation signal thereof is implemented as a feedback iterative configuration.

According to still further features in the described preferred embodiments, the MIMO system is a linear MIMO system, and the identifying the model of the at least one digital input signal providing at least one analog representation signal thereof comprising LMS technique.

According to still further features in the described preferred embodiments, the MIMO system receives the synchronization clock used for timing According to another aspect of the present invention, there is provided a method for constructing at least one digital input signal and providing analog representation thereof including the steps of: (a) feeding a DSP with at least one digital input signal and synchronization clock, (b) occasionally or within a repetitive training period, the DSP is identifying a model of at least one discrete output device and m MIMO stages, referred to as constructing device, for creating a representation of the relationships between digital outputs of the DSP and at least one analog output signals of m MIMO stages, (c) calculating n digital outputs, by using the at least one digital input signal and the identified model of the constructing device, (d) the n digital outputs are received by the at least one discrete output device comprising, in total, n digital inputs, m analog outputs, and simple conversion rules between the n digital inputs and the m analog outputs, (e) corresponding MIMO stage to each one of the m analog outputs, excluding first MIMO stage, are receiving at least one analog input signal from the preceding stage and the appropriate analog signal the at least one discrete output device; first MIMO stage is receiving only the appropriate analog signal from the at least one discrete output device; all m MIMO stages are providing at least one output analog signal; last MIMO stage is providing at least one output analog signal equivalent to the digital input signal.

According to still further features in the described preferred embodiments, each of the m MIMO stages comprising attenuating the signal, and adding a predefined constant or subtracting the predefined constant from the attenuated signal, according to the DSP decision.

According to still further features in the described preferred embodiments, the calculating n digital outputs is by inverting the model by using internal controller in order to keep the error to be within a deterministic or probabilistic set of predefined constraints and internal constructing device for implementing, in the digital domain, the mathematical equivalence of the transfer function of the constructing device.

According to still further features in the described preferred embodiments, the calculating n digital outputs comprising: computing ISI terms, adding or subtracting the ISI terms from the digital input signal.

According to still further features in the described preferred embodiments, the MIMO system is time varying according to the synchronization clock.

According to still further features in the described preferred embodiments, the model is identified by applying an identification algorithm that is using an a-priori statistical knowledge.

According to still further features in the described preferred embodiments, the constructing device is enclosed in a system performing several signal processing functions which contains information regarding the analog representation signal, and the information is sufficient for enabling an identification algorithm of the model constructing device.

According to still further features in the described preferred embodiments, an analog signal sampler comprising a system model with unknown parameters is used for identifying the model of a constructing device, and unknown parameters of both models are identified by joint model identification algorithm, and the joint model identification algorithm is based on feeding the constructing device with at least one known training sequence.

According to still further features in the described preferred embodiments, the identifying a model comprising low speed components sampling the at least one analog representation signal every few samples and training only on the sampled samples.

According to still further features in the described preferred embodiments, the calculating n digital outputs is by inverting the model by using internal controller in order to keep the error to be within a deterministic or probabilistic set of predefined constraints and internal constructing device for implementing, in the digital domain, the mathematical equivalence of the transfer function of the constructing device.

According to still further features in the described preferred embodiments, the MIMO system is a linear MIMO system.

According to still further features in the described preferred embodiments, the constructing at least one digital input signal and providing analog representation thereof including the steps of: (a) at least one additional discrete output devices, and MIMO system having a model, being fed by the at least one digital input signal and the synchronization clock, (b) identifying the model of the MIMO system and the additional MIMO system by applying joint model identification algorithm.

According to still further features in the described preferred embodiments, the at least one digital input signal providing at least one analog representation signal thereof is implemented as a multi-stage configuration.

According to still further features in the described preferred embodiments, the at least one digital input signal providing at least one analog representation signal thereof is implemented as a multi-stage configuration and the multi-stage configuration comprising an iterative control; the iterative control is transferring a residual error to subsequent stages in each stage where the control function is successfully implemented.

According to still further features in the described preferred embodiments, the at least one digital input signal providing at least one analog representation signal there of is implemented as a feedback iterative configuration.

According to still further features in the described preferred embodiments, the MIMO system is a linear MIMO system, and the identifying the model of the at least one digital input signal providing the analog representation thereof comprising LMS technique.

According to another aspect of the present invention, there is provided a device for constructing at least one digital input signal and providing analog representation thereof, including the steps of: (a) A DSP fed with at least one digital input signal and synchronization clock, (b) the DSP, occasionally or within a repetitive training period, is identifying a model of at least one discrete output device and m MIMO stages, referred to as constructing device, for creating a representation of the relationships between digital outputs of the DSP and at least one analog output signals of m MIMO stages, (c) the DSP is calculating n digital outputs, by using the at least one digital input signal and the identified model of the constructing device, (d) the n digital outputs are received by the at least one discrete output device comprising, in total, n digital inputs, m analog outputs, and simple conversion rules between the n digital inputs and the m analog outputs, (e) corresponding MIMO stage to each one of the m analog outputs, excluding first MIMO stage, are receiving at least one analog input signal from the preceding stage and the appropriate analog signal the at least one discrete output device; first MIMO stage is receiving only the appropriate analog signal from the at least one discrete output device; all m MIMO stages are providing at least one output analog signal; last MIMO stage is providing at least one output analog signal equivalent to the digital input signal.

According to still further features in the described preferred embodiments, each of the m MIMO stages comprising an amplifier.

According to still further features in the described preferred embodiments, the amplifier is selected from the group consisting of: 1) a transconductance amplifier, and 2) an integrated capacitor and a switch, and 3) an integrated capacitor, a switch and a resistor.

According to still further features in the described preferred embodiments, the analog representation having RMS below 10 mili volt at frequency above 10 MHz.

According to still further features in the described preferred embodiments, the model incorporates and compensated for most of the noise created by the digital input signals device of the present invention, contaminating the digital input signal or the intermediate signals.

According to still further features in the described preferred embodiments, the synchronization clock is a signal selected from the group consisting of fixed pulse shape and frequency, and any deterministic signal featuring frequency.

According to still further features in the described preferred embodiments, the identifying comprising identify the inverse relation.

According to still further features in the described preferred embodiments, the DSP is identifying a model comprising a training generator feeding at least one known digital signal to the at least one digital input signal in a training period, and reading the known digital signal and digital result from at least one ADC connected to the at least one analog representation signal, and identifying the model of the constructing device by applying a system identification algorithm.

According to still further features in the described preferred embodiments, the at least one known digital signal comprising a sequence of independently and identically uniformly distributed pseudo-random numbers.

According to still further features in the described preferred embodiments, the DSP is implemented by two separate DSPs According to still further features in the described preferred embodiments, the training generator is implemented within the DSP.

According to still further features in the described preferred embodiments, the model is identified by applying an identification algorithm that is using an a-priori statistical knowledge.

According to still further features in the described preferred embodiments, the constructing device is enclosed in a system performing several signal processing functions which contains information regarding the at least one analog representation signal, and the information is sufficient for enabling an identification algorithm of the model constructing device.

According to still further features in the described preferred embodiments, an additional signal constructor comprising a system model with unknown parameters is used for identifying the model of a constructing device, and unknown parameters of both models are identified by joint model identification algorithm.

According to still further features in the described preferred embodiments, the identifying a model comprising low speed components sampling the at least one output analog signal every few samples and training only on the sampled samples.

According to still further features in the described preferred embodiments, the discrete output devices comprising at least one low resolution digital to analog converter.

According to still further features in the described preferred embodiments, the MIMO system is selected from the group consisting of continuous MIMO system, and MIMO system having a unified model, and continuous MIMO system having a unified model.

According to still further features in the described preferred embodiments, the MIMO system is a linear MIMO system.

According to still further features in the described preferred embodiments, the device is implemented as a multi-stage configuration.

According to still further features in the described preferred embodiments, the device is implemented as a multi-stage configuration and the multi-stage configuration comprising an iterative control; the iterative control is transferring a residual error to subsequent stages in each stage where the control function is successfully implemented According to another aspect of the present invention, there is provided a multi-stage digital signals constructor, wherein each stage including the steps of: (a) amplifier amplifying an input digital signal, (b) means for approximately integrating the amplified digital signal, (c) means for synchronizing the multi-stage digital signals constructor, (d) means for comparing the integrated amplified digital signal with a threshold, and adding at least one predefined correction to the amplified digital signal, (e) means for constructing an analog output signal representing the analog input signal to the multi-stage digital signals constructor.

According to still further features in the described preferred embodiments, the analog output signal having RMS below 10 mili volt at frequency above 10 MHz.

According to still further features in the described preferred embodiments, the means for comparing the integrated amplified digital signal with a threshold comprising a training generator feeding at least one known digital signal to the input digital signal in a training period, and reading the known digital signal and digital result from at least one ADC connected to the at least one analog output signal, and identifying the model of the multi-stage digital signals constructor by applying a system identification algorithm.

According to still further features in the described preferred embodiments, the training generator is implemented within the DSP.

According to another aspect of the present invention, there is provided a parallel multi-stage digital input constructor including the steps of: (a) plurality of digital input constructors receiving at least two different digital input signals, (b) the plurality of digital input constructors are placed on the same silicon substrate, featuring crosstalk between the plurality of digital input constructors, (c) a common DSP for treating the crosstalk effect, whereby each stage of each multi-stage digital input constructor comprising: amplifier amplifying an input digital signal, integration means for integrating the amplified digital signal, a synchronization clock synchronizing the multi-stage digital input constructor, and adding at least one predefined correction to the amplified digital signal.

According to another aspect of the present invention, there is provided a method for constructing at least one digital input signal and providing at least one analog representation signal thereof including the steps of: (a) feeding a DSP with the at least one digital input signal and a synchronization clock, (b) the DSP is calculating n digital outputs, by using the at least one digital input signal and a model of the constructing device, whereby the model can be considered as having sufficient accuracy, (c) the n digital outputs are received by k discrete output devices comprising, in total, n digital inputs, m analog outputs, and simple conversion rules between the n digital inputs and the m analog outputs, (d) the MIMO system receiving the m analog outputs, and providing at least one output analog signal equivalent to the al least one digital input signal.

According to still further features in the described preferred embodiments, the sampler can be considered as time invariant by using analog or digital compensation methods.

BRIEF DESCRIPTION OF THE DRAWINGS

The present invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the present invention. In this regard, no attempt is made to shown structural details of the present invention in more detail than is necessary for a fundamental understanding of the invention, the description taken with the drawings making apparent to those skilled in the art how the several forms of the invention may be embodied in practice. Identical structures, elements or parts which appear in more than one figure are preferably labeled with a same or similar number in all the figures in which they appear. In the drawings.

DESCRIPTION OF THE PREFERRED EMBODIMENTS

Figure 1:
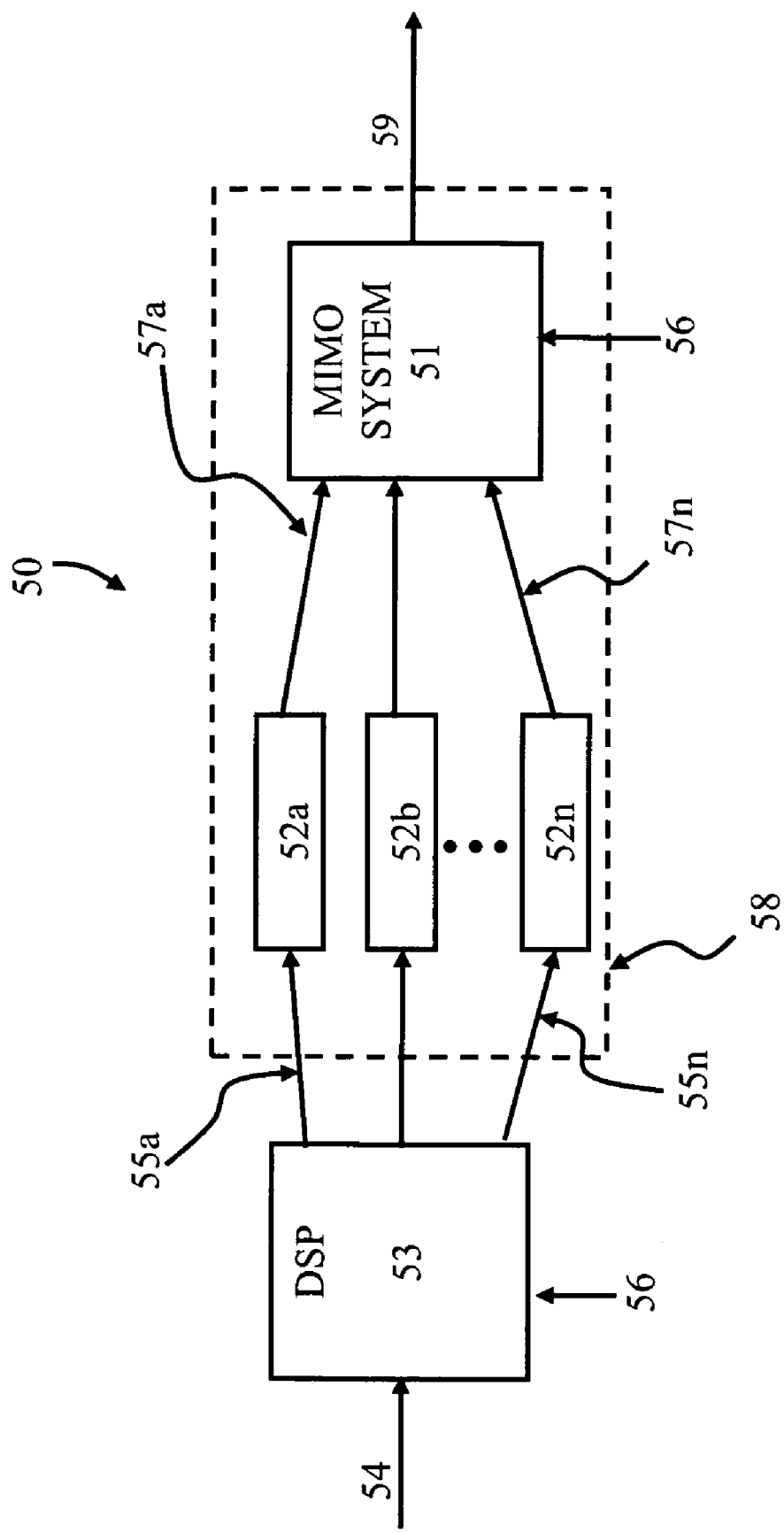
FIG. 1 is a schematic diagram illustrating the preferred embodiment of the generalized Digital Input Signal Constructor of the present invention.

The present invention relates to digital input signals construction and, more particularly, to method and corresponding device for constructing at least one digital signal and providing analog representation thereof, featuring a DSP, discrete output devices, and Multi Input Multi Output (MIMO) system, wherein the MIMO system is constructed from low accuracy components featuring high bandwidth, high gain, and low current consumption.

The present invention successfully addresses shortcomings and limitations of presently known methods for constructing digital input signals and providing analog representation thereof, by being simpler, more rapid, and therefore, more cost effective, than currently used techniques for providing accurate conversion of digital signal representation to its constructed analog equivalent. The method of the present invention is readily implemented using analog parts and digital parts. Analog parts are selected from: analog discrete parts, integrated circuit or RF components. The digital parts are selected from: discrete digital parts, integrated digital parts, mixed signal ASIC, or separate analog and digital ASIC. The digital part of the constructor of the present invention can also be implemented in a general purpose DSP or CPU. The general purpose DSP or CPU can be embedded, not embedded, or stand-alone computer (e.g. PC).

Moreover, the method and device of the present invention are generally applicable as a 'stand-alone' device for digital input signals construction, or, as a component used in combination with other methods, devices, and systems, using the constructed analog signal.

The terms "constructing device", and "digital to analog waveform converter" may be used herein interchangeably.

The present invention features a unique method, and a corresponding digital input signals construction device featuring high rate of digital input signals constructing and providing analog representation thereof, with low power consumption.

For example, a constructor in accordance with the present invention may consume average current in the order of 1 mili-Ampere (mA) when constructing an analog signal featuring bandwidth of 50 MHz.

This is in strong contrast to the previous art constructors consuming about 50-100 mA when constructing an analog output signal featuring the same bandwidth and accuracy, when both implemented in the same device technology.

Another unique feature is that for high-speed signals, the method of the present invention achieves better precision, compared with the previous art constructors. This significant improvement is a result of the fact that the offsets, components inaccuracy, and unintentional delay in one clock wire relative to other wires distributing the same clock, known as clock skew, can be described by the general model and compensated by the adaptive algorithm described below.

Another unique feature of the method of the present invention is the high robust designing method, compensating all inaccuracies in the adaptive algorithm described below. Moreover, the constructor in accordance with the present invention can be easily scaleable through geometry changes in the fabrication technology.

Still another unique feature of the digital input signals constructor of the present invention is that the assembling blocks of the constructor are well available in most of the common low cost digital CMOS commercial fabrication processes and therefore do not require a special fabrication process and are easily incorporated in a mixed signal chip containing also large and complex digital blocks.

Still another unique feature of the digital input signals constructor of the present invention is the high usable amplitude range (dynamic range) of the digital input signal. The high dynamic range is achieved by the non-obvious structure of the digital input signals constructor of the present invention, rarely found on previous art digital input signals constructors, designed such that the Signal to Noise Ratio (SNR) is almost independent on the average signal power within the required dynamic range.

For example, an output analog signal featuring average RMS of 1 mili volt (mV) may be constructed by the digital input signals constructor of the present invention with SNR=48 dB, while feeding the same digital input signals constructor with an digital input signal corresponding to analog signal featuring average RMS of 100 mV may also be constructed with SNR=48 dB, given these two output analog signals feature the same statistical distribution.

Still another unique feature of the digital input signals constructor of the present invention is the ability to construct low power signals. This significant feature is a result of the low self-noise of the digital input signals constructor of the present invention. The low self-noise of the digital input signals constructor of the present invention is a result of its very low power operation, creating less noise contaminating the digital input signal. Moreover, most of the noise created by the digital input signals constructor of the present invention, contaminating the digital input signal or the intermediate signals, can be incorporated into the model and compensated for. For example, the constructor of the present invention can provides a RMS output of 1 mili volt while operating in 100 MHz.

Still another unique feature of the digital input signals constructor of the present invention is its low price resulting from the very small footprint needed for implementation, and the fact that the building blocks are simple, inaccurate, and consume low power.

Still another unique feature of the digital input signals constructor of the present invention is that in contrary to the various kind of previous art constructors, the constructor of the present invention is not made of sequence of separate stages, wherein each stage operates without memory and independently produces discrete value to the next stage. The constructor of the present invention features a unified model describing all the stages of the constructor. Moreover, in a case where it is useful to construct the constructor of the present invention from two or more stages, there may be interconnections, and/or feedback or other dependencies between the various stages, which makes it necessary to use a unified model rather than independent model for each stage. Moreover, typically some or all of the stages models include the influence of previous values. Those novel interconnections between the models describing the constructor of the present invention are one of the reasons that the present invention achieves its high performances.

It is to be understood that the present invention is not limited in its application to the details of the order or sequence of functions and/or tasks and/or steps and/or operations or implementation of the method for constructing at least one digital signal and providing analog representation thereof or to the details of construction, arrangement, and, composition of the corresponding digital input signals constructor thereof, set forth in the following description, drawings, or examples. The present invention is capable of other embodiments or of being practiced or carried out in various ways. Moreover, it is to be understood that the phraseology, terminology, and, notation, employed herein are for the purpose of description and should not be regarded as limiting. Moreover, the method and corresponding device of the present invention for construction at least one digital signal and providing analog representation thereof can be implemented in a variety of configurations, for example, Multi Input Multi Output (MIMO) system 51 and discrete output devices 52 illustrated in FIG. 1, may be of variable configuration, including, but not limited to, multi-stage implementation, as illustrated for example in FIG. 4, or iterative implementation using one stage and feedback.

Throughout the following description and accompanying drawings there is first provided description of the preferred embodiment of the generalized method and corresponding digital input signals constructor of the present invention, followed thereafter by detailed descriptions and illustrations of two different exemplary preferred embodiments of the generalized method and corresponding digital input signals constructor of the present invention.

The preferred embodiment of the generalized method and corresponding digital input signals constructor of the present invention is illustrated in FIG. 1. The preferred embodiment of the generalized method and corresponding digital input signals constructor is readily extendable and applicable to the following description of exemplary preferred embodiments of the generalized method and corresponding digital input signals constructor of the present invention.

Figure 4:
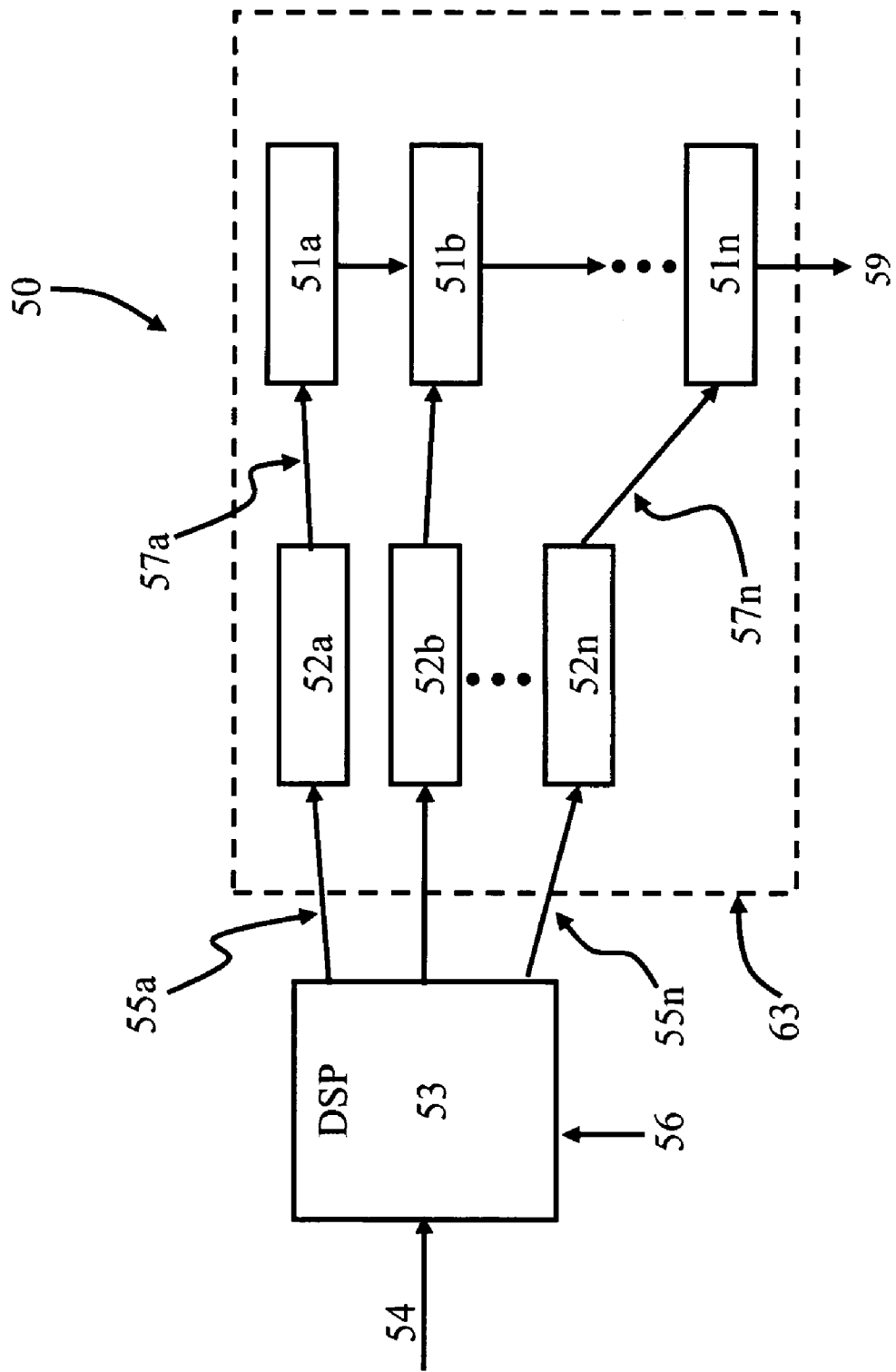
FIG. 4 is a schematic diagram illustrating a multi-stage exemplary preferred embodiment of the generalized method and corresponding digital input signal constructor of the present invention.

An exemplary preferred embodiment of the generalized method and corresponding digital input signals constructor of the present invention, relates to a multi-stage type configuration of the digital input signals constructor disclosed in the preferred embodiment of the generalized method, whereby Multi Input Multi Output (MIMO) system 51 is implemented as multi-stages, as illustrated in FIG. 4. It is to be understood that the multi-stage configuration in accordance with the present invention can be easily scaleable through duplications of its stages, as is well known in the art of electronic hardware design. Increasing the number of stages increases the accuracy of the analog signal construction in relation to the digital input representation, until an accuracy limit is reached. The accuracy limit is due to noise sources and/or device nonlinearities and/or other factors. Moreover, increasing the number of stages beyond this limit is useful for increasing the dynamic range and/or for generating small outputs. In order to enhance the increased dynamic range feature of the constructor, the outputs of the DSP featuring large effect are made to change less frequently when low analog output signal is generated.

An alternative exemplary preferred embodiment of the generalized method and corresponding digital input signals constructor of the present invention, relates to a similar multi-stage type configuration of the previous exemplary embodiment, but, here, there are plurality of multi-stage constructors constructing the same digital input signal.

In the following description of the method of the present invention, included are only main or principal functions and/or tasks and/or steps and/or operations needed for sufficiently understanding proper 'enabling' utilization and implementation of the disclosed method and corresponding device for constructing at least one digital signal and providing analog representation thereof. Accordingly, descriptions of the various required or optional minor, intermediate, and/or, sub functions/tasks/steps/operations, which are readily known by one of ordinary skill in the art, and/or, which are available in the prior art and technical literature relating to the field of constructing digital input signals, are not included herein.

Functions and/or tasks and/or steps and/or operations and/or, components, and/or implementation of the method and corresponding device for constructing at least one digital signal and providing analog representation thereof, according to the present invention, are better understood with reference to the following description and accompanying drawings.

The preferred embodiment of the generalized method for constructing at least one digital signal and providing analog representation thereof, in accordance with the present invention, is described herein. Referring now to the drawings, FIG. 1 is a schematic diagram illustrating the preferred embodiment of the generalized digital input signals constructor of the present invention.

In FIG. 1, the device for constructing at least one digital signal and providing analog representation thereof, hereinafter, referred to as Digital Signal Constructor 50, features the following primary components: (a) Digital Signal Processor (DSP) 53, (b) n discrete output devices 52a-n, and (c) Multi Input Multi Output (MIMO) system 51. It is to be understood that all hereinafter disclosure is only representing the main and important parts of the method for constructing at least one digital signal and providing analog representation thereof, and may be executed in parallel hardware design. For example, DSP 53 is converting digital input signal to n digital inputs. The n digital inputs are received by n discrete output devices 52a-n. MIMO system 51 receives the n analog outputs from the n discrete output devices 52, and featuring at least one output which is an analog representation of the digital input signal.

In the preferred embodiment of the generalized method of the present invention there is feeding Digital Signal Processor (DSP) 53 with at least one digital input signal 54 and a synchronization clock 56.

At least one digital input signal 54 is the digital input signal to be constructed by Digital Signal Constructor 50 as the constructed analog signal, equivalent to the digital input signal 54.

Synchronization clock 56 may be a signal featuring fixed pulse shape and frequency, or any other deterministic signal or signals featuring frequency. Synchronization clock 56 is used for timing some or all of the components of the constructor of the present invention.

There is, occasionally or within a repetitive training period, DSP 53 identifying the model of constructing device 58, for creating a representation of the relationships between DSP digital outputs 55a-n and at least one of constructing device 58 analog output signals 59, wherein constructing device 58 features discrete output devices and MIMO system 51.

In an exemplary embodiment of the present invention, discrete output devices are n discrete output devices 52a-n as illustrated in FIG. 1. The identification process of the model of n discrete output devices 52a-n and MIMO system 51, referred to as constructing device 58, may be done according to one of the following five exemplary identification processes.

Usually the constructing device 58 output is sampled during the identification, and/or the identification relates the input to samples of the output instead of to its continuous output. Whenever the sample rate satisfies the Nyquist criterion, the relation to the sampled signal is known to be sufficient to describe the relation of the digital input to the continuous signal in the frequency band of interest.

Optionally, a low pass filter is following constructing device 58 or incorporated within constructing device 58, for filtering out undesired predefined frequency band. Undesired predefined frequency band is characterized by the fact that it has no good reconstruction. For example, undesired predefined frequency is any frequency above half the sampling rate. Moreover, the identification process may not identify the transfer function of constructing device 58 explicitly, but identify only the inverse relation needed between the digital correction signals and the digital input signals 54.

In an exemplary embodiment of the present invention, constructing device 58 is time invariant, or features small enough variation, or can be made almost time invariant by using analog or digital compensation methods. Analog or digital compensation methods are known in related fields such as signals samplers, as described for example in PCT/IL04/739 of the same inventor of the present invention. In this exemplary embodiment, the model of constructing device 58 can be assumed known, though typically with low accuracy. In a case where the application using the results of constructing device 58 does not demand higher accuracy, no training is necessary.

Figure 2:
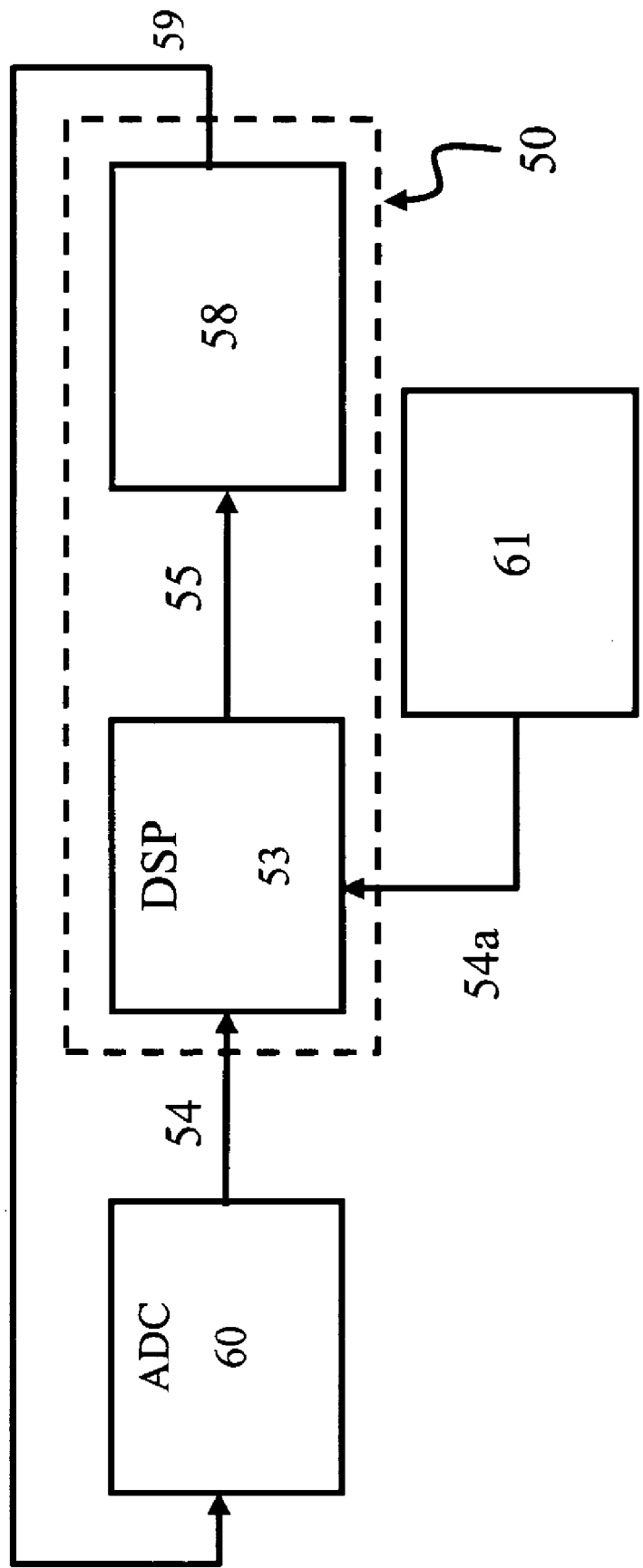
FIG. 2 is a schematic diagram illustrating an exemplary method for identifying the model of the digital input signal constructor of the present invention.

Referring to FIG. 2, in the first exemplary identification process there is: (a) feeding known digital signal 54a or signals to the at least one digital input signal in a training period, (b) DSP 53 is reading the known digital signal 54a and the digital result 54 from ADC 60, (c) DSP 53 is identifying the model of constructing device 58 by applying system identification algorithm, based on the known digital input signals and digital result from ADC 60. For example, whenever the model to be identified is non-linear, well known in the art non-linear models identification algorithms based on known inputs are neural networks and Volterra series. An exemplary reference book is: Adaptive Wireless Trancievers by L. Hanzo, C. H. Wong, M. S. Yee, Wiley ISBN 0470-84689-5.

Figure 2A:
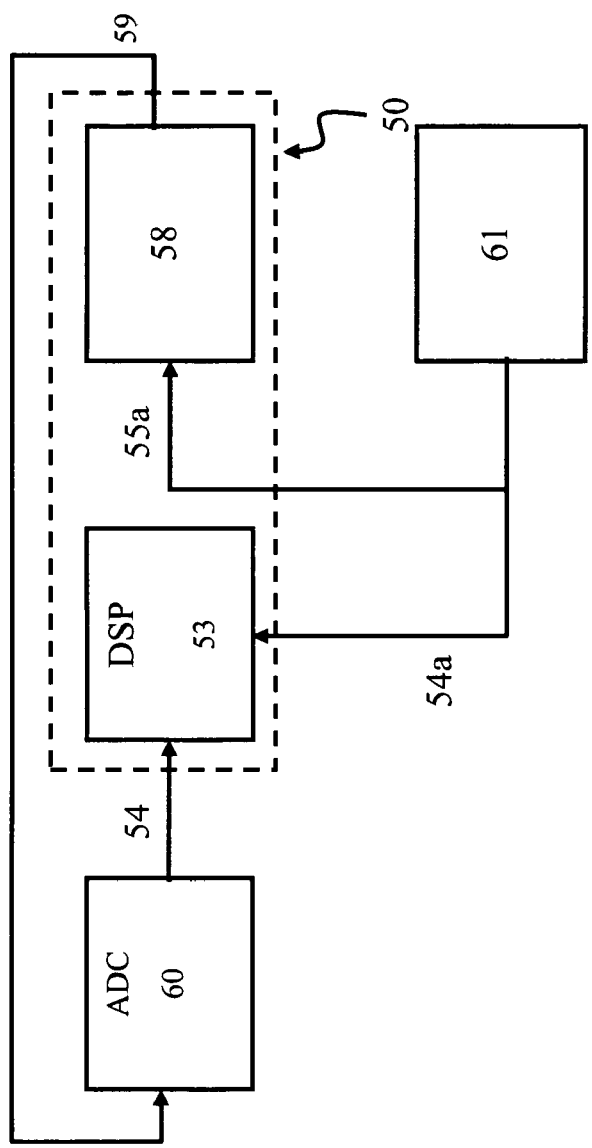
FIG. 2a is a schematic diagram illustrating another exemplary method for identifying the model of the digital input signal constructor of the present invention.

The known digital signal or signals fed to the at least one digital input signal 54a may be produced by a well known in the art devices, driving the at least one digital input signal 54a, as illustrated in FIG. 2. The training signal output from training generation unit 61 is preferably a sequence of independently and identically uniformly distributed pseudo-random numbers. The output of the training generation unit 61 is entered either as a digital input signal 54a or directly to the input of constructing device 58, or to DSP 53 as illustrated in FIG. 2a. During training in the mode as illustrated in FIG. 2a the model inversion part of the DSP may be disabled. The output of the ADC is entered also to the DSP and the training is done in the DSP. An exemplary embodiment of using Digital Signal Constructor 50 on a continuous signal without disrupting its operation when feeding the known digital signal or signals to the at least one digital input signal 54, or directly into constructing device 58 during a training period, is using more than one Digital Signal Constructor 50 and alternating between the constructors each time one of the constructors is trained.

It is to be understood that DSP 53 described in first exemplary identification process can be implemented by two separate DSPs. Those two separate DSPs can optionally be implemented differently. For example, the first DSP can be implemented in hardware and the other implemented in software or on a general purpose DSP, wherein the first DSP is the DSP of the constructor and the second DSP is running the model identification algorithm. Moreover, training generation unit 61 can be implemented within DSP 53.

In the second exemplary identification process, whenever there is a-priori statistical knowledge of the at least one digital input signal 54, whereas an external device using the analog output measures the deviation of the signal from the statistical properties, and such deviation is forwarded to DSP 53, the model of Digital Signal Constructor 50 may be identified by applying an identification algorithm that is using the a-priori statistical knowledge without requiring the training periods.

In the third exemplary identification process, whenever the constructor is enclosed in a system performing several signal processing functions, and that system contains some information regarding the at least one analog output signal 59, that information may be sufficient for enabling an identification algorithm of the model of Digital Signal Constructor 50, without requiring the training periods. Some exemplary systems performing several signal processing functions that may contain some information regarding the at least one analog output signal 59 are: modem, pulse shaper, equalizer, down converter, decoder, and demodulator.

In the fourth identification process, whenever an additional signal sampler or analog to digital converter 60 featuring a system model with unknown parameters is used for identifying the model of Digital Signal Constructor 50, unknown parameters of both systems can be identified by joint model identification algorithm, executed on DSP. A signal sampler featuring a system model with unknown parameters is described for example in PCT/IL04/739 of the same inventor of the present invention. The identification is done by using training generation unit 61 that is feeding DSP. In an exemplary embodiment, the functions of identification and training are performed in a first DSP and the functions of signal construction or model inversion are performed on a second DSP. The second DSP should be fast and small and may be implemented using dedicated hardware.

In an exemplary system, wherein both analog to digital converter and Digital Signal Constructor are adaptive and trained together, it may occur that the scaling of the signal is lost during the model parameters identification process. In that case, the reconstructed signal features an unknown, but constant, gain. Whenever the scaling of the signal is important, a reference signal may be used in order to scale the result. The unknown gain might slightly depend on the frequency. Whenever the flatness of the signal is important, such reference signal should comprise of several frequencies. For example, additional switch can be used to select between the input signal and the reference signal. The reference signal can for example be sinusoid of certain frequency and known amplitude, and several such frequencies are used. In case the flatness of the signal is not crucial, DC reference signal may be used for simplicity.

In the fifth identification process, the training is executed by using low speed components. In an exemplary embodiment, there are low speed ADC (either as fixed reference or trained together) used for the training, by sampling the output of the constructor every few samples (for example every 10 samples) and training only on the sampled samples. In an alternative embodiment, there is a low speed DAC reference, and the training digital signal is fed both to the low speed DAC reference and to the Digital Signal Constructor 50. The analog output signals of low speed DAC reference and Digital Signal Constructor 50 are subtracted in order to create an error signal. The error signal is sampled accordingly using a low resolution ADC or even one bit ADC. The result is fed to the DSP for training.

Optionally, all identification processes can be performed in the background by interleaving input and training signals. However, this option affects the usable rate of operation.

Due to environmental changes, there is a need to periodically repeat the identification process of the model of Digital Signal Constructor 50 in order to update the model parameters. Whenever Digital Signal Constructor 50 is time invariant, there is no need to periodically repeat the identification process of the model of Digital Signal Constructor 50 in order to update the model parameters.

It is to be understood that constructing device 58 may feature a unified model describing all of its stages. Moreover, in a case where it is possible to split the model of constructing device 58 to two or more models, there are interconnections between the models and some or all of the models may remember previous values. The generation of a unified model from the separate stages description as multi-port electrical device is well known part of the electrical networks theory.

It is to be understood that without loosing generality, the model of Digital Signal Constructor 50 can be the inverse model describing the relationships between constructed analog signals and one or more of constructing device 58 input signals.

DSP 53 is converting digital input signal to n digital inputs to n discrete output devices 52. The discrete output devices 52 can take an output value selected from a set of few values, or alternatively a waveform selected from a set of waveforms. For example, the n discrete output devices 52 may be low resolution digital to analog converters or one bit digital to analog converters. MIMO system 51, featuring at least one output, receives the n analog outputs from the n discrete output devices 52.

By using the at least one digital input signal 54 and the identified model of constructing device 58, there is DSP 53 calculating n digital outputs 55*a-n*, such that output 59 is an analog construction of digital input 54.

Figure 3:
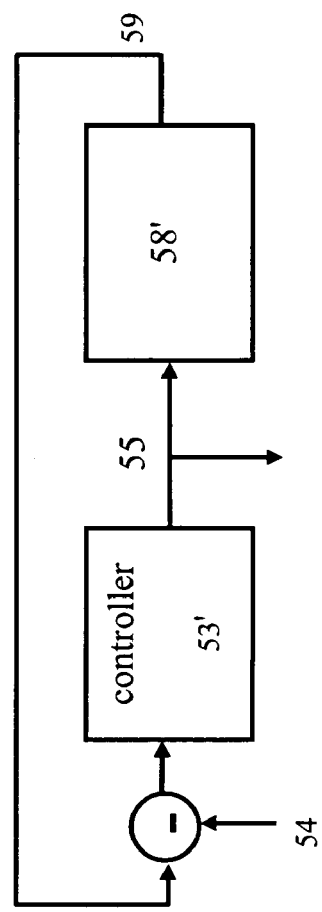
FIG. 3 is a schematic diagram illustrating an exemplary inverting scheme model.

Exemplary way of generating outputs 55*a-n* according to desired input is by inverting the model of constructing device 58. FIG. 3 is illustrating en exemplary scheme for inverting the model. Internal controller 53' and internal constructing device 58' are blocks internal to DSP 53. Internal blocks 53' and 58' can be implemented in hardware, software or by any mathematically equivalent form. It is to be understood that FIG. 3 is illustrating two separate blocks only for functional description and other equivalent implementations can be constructed.

Internal controller 53' is implementing a negative feedback control loop by feeding internal constructing device 58' with digital outputs 55, in order to keep at least one of the error to be within a deterministic or probabilistic set of predefined constraints. The error is defined as the digital representation of analog output 54 less the calculated digital representation of analog output 59.

Internal controller 53' receives digital input 54 and provides digital outputs 55. Digital outputs 55 are the same as digital outputs provided by DSP 53. Internal constructing device 58' implements, in the digital domain, the mathematical equivalence of the transfer function of constructing device 58, assuming that the transfer function of constructing device 58 is identified in the training period. Internal controller 53' should keep the error as low as possible. Whenever internal controller 53' is successful, the error is small and the same digital outputs 55 provided to the internal constructing device 58' in the model is provided by the DSP to the real constructing device 58. If the model identification was accurate, the output of the real constructing device 58 is the same as the output of the internal constructing device 58' model. In case the model represents the relation between the input 55 and the samples of the output 59, the output of the real constructing device 58 is the same as the output of the internal constructing device 58' model just in the sampling points. The unknown signal components generated between the sampling points, generate frequency components above half the sampling rate. As known in the art, low pass filter at half the sampling rate may be used to remove these usually undesired components.

The n digital outputs 55*a-n* are received by k discrete output devices featuring, in total, n digital inputs, m analog outputs, and simple conversion rules between the n digital inputs and the m analog outputs.

In the general embodiment of the present invention, discrete output devices have several digital inputs and several analog outputs, wherein the digital inputs select among few possible waveforms for each of the analog outputs.

In an exemplary embodiment of the present invention, as illustrated in FIG. 1, the discrete output devices receiving the n digital inputs are made of n discrete output devices 52*a-n*. In an exemplary embodiment, the n discrete output devices 52*a-n* are low resolution digital to analog converters or a one bit digital to analog converters. In this case, the number n (of n digital inputs) is equal to m (of m analog outputs), and is referenced by 57*a-n*

In an exemplary embodiment of the present invention, discrete output devices receive synchronization clock 56, used for timing.

Moreover, in an exemplary embodiment of the present invention, the discrete output devices accept the digital input signal at every clock. In an exemplary embodiment, the value of the m analog outputs of discrete output devices is selected between few possible values according to the digital input signal. In an exemplary embodiment, the analog outputs of discrete output devices are constant during the clock period. In an alternative exemplary embodiment, the value is time varying according to some pulse shape. The pulse shape can be different for each value and for each unit, and do not have to be accurately known apriori.

There is MIMO system 51 receiving the m analog outputs of discrete output devices, and providing at least one output analog signal 59 equivalent to the digital input signal 54.

Constructing device 58 is characterized by the fact that, at least approximately, the relationship between: (a) at least one of the digital input signals to constructing device 58, and (b) at least one of the analog output signals from constructing device 58, can be described by a model. Moreover, constructing device 58 is characterized by the fact that the relationship between: (a) at least one of the digital input signals to constructing device 58, and (b) at least one of the analog output signals of constructing device 58, can be described by a model having practical accurate identification algorithm.

In an exemplary embodiment of the present invention, MIMO system 51 receives synchronization clock 56, used for timing.

It is to be emphasized, that even in the case that operation of MIMO system 51 is time varying and thus depends on a synchronization clock 56, the MIMO system 51 operates on signals that are analog and time continuous. Moreover, MIMO system 51 outputs signals that are analog and time continuous. Hereinafter such a MIMO system is referred to as a "continuous MIMO".

In an exemplary embodiment of the present invention, wherein MIMO system 51 is linear, and each discrete outputs device is a one bit outputs device, and analog output signal is a single signal, the training signal output from training generation unit 61 is a sequence of independently and identically uniformly distributed pseudo-random numbers, connected to MIMO system 58 as illustrated in FIG. 2a, the following system analysis is due:

If MIMO system 58 has one output, it is a MISO. Let v denote a vector of N binary inputs 55a to the MISO represented as +1 and −1.

Let t denote the sampled output (output of ADC 60 in FIG. 2a). Let C denote the coefficients of the model, and d denote the DC component. In general, C is a matrix, and the discrete time MISO model is t'=trace(C*V)+d, where V is a matrix of n vectors v which contribute to sample t'. t' is the reconstructed sample using the estimated model using C. t' might be slightly different from t due to inaccuracies of the model and noises added during the sampling of t.

An exemplary training of a model featuring a linear MISO can be done with the well known in the art Least Mean Squares (LMS) algorithm:

$$e = t - (\text{trace}(C*V) + d)$$

$$C = C - \mu*e*V$$

$$d = d - \mu*e$$

where e is the error, and μ is the update coefficient of the LMS algorithm.

Above training can be implemented on prior art signal constructors featuring independent stages without ISI. Such model estimation can be more accurate than the recursive stage by stage estimation.

Depending on the selected method from the method described above, a MISO to be useful should have an inverse, or have a controller that can bring the error to a small value. The smaller the error, the more accurate the signal-constructor is.

When the MISO is linear, there is a property of the MISO that in many cases enables a good inverse:

The gain a_i between input i and the output is decreasing, and the ratio a_i/a_(i+1) should be between 0.5 to 1.

If the gain is lower than 0.5, no stable loop is possible in FIG. 3. If the gain is close to 1, the constructor error magnitude will be large in relation to the signal. An exemplary value of about 0.6 can be a good choice.

The gain of an output, denoted by Yj, relative to an input, denoted by Xi, of the linear MIMO system is defined as the square root of the power at the output to the power at the input:

$$\text{gain} = \sqrt{\frac{P(Yj)}{P(Xi)}}$$

where 'P' denotes average power. It is to be understood that the definition of the gain can have other equivalent or similar formulations without affecting the generalization of the present invention. The gain is measured by feeding linear MIMO system with an analog test signal at input Xi and measuring the power of the analog test signal at the desired output Yj, while: (a) all the inputs of linear MIMO system are set to zero (including the control inputs), (b) the Xi analog test signal is small enough so that any point within the system is within the linear range, (c) the Xi analog test signal features the same properties as typical analog signal at the input of the sampler, and in particular, features the same spectral properties and amplitude distribution as typical analog signal at the input of the sampler, although the test signal may have smaller amplitude.

Moreover, although above analyzed system features one digital input signal to be sampled and one analog output signal, the extension to multiple input signals and multiple output signals is straightforward and fall within the scope of the present invention.

Moreover, it is to be understood that Digital Signal Construction 50, featured components, and different positions of thereof, as illustrated in FIG. 1, is only a representative of the method and device for constructing at least one digital input signal and providing analog representation thereof, of the present invention. DSP 53, discrete output devices, and MIMO system 51, may feature variable configurations, including, but not limited to, multi-stage implementation and feedback iterative implementation. Moreover, MIMO system 51 can be linear or nonlinear. For example, FIG. 4 illustrates a multi-stage configuration of the Digital input Signal Constructor of the present invention. Moreover, multi-stage configuration including an iterative control may reduce the complexity of the control function by transferring the residual error to subsequent stages in each stage where the control function is successfully implemented. Moreover, the multi-stage architecture is highly scalable since additional stages or units can be easily added.

Optionally, in the multi-stage exemplary embodiments described below, the MIMO system is composed of several stages but is characterized by the fact that its model is not made of an aggregation of multiple models of each stage. Constructing device 58 features a unified model describing all of its stages. Moreover, in a case where it is possible to split the model of constructing device 58 to two or more models, there are interconnections between the models and some or all of the models may remember previous values.

It is to be clearly understood that above described Digital Input Signal Constructor 50 is extendable and applicable to the following description of exemplary preferred embodiments of the generalized method, along with corresponding exemplary preferred embodiments of the generalized digital input signals constructing device, of the present invention, as described herein.

Herein described the first multi-stage exemplary preferred embodiment of the generalized method and corresponding digital input signal constructor of the present invention. The first multi-stage exemplary preferred embodiment, as illustrated in FIG. 4, relates to a multi-stage type configuration of the constructor disclosed above in the preferred embodiment of the generalized method. The multi-stage type constructor configuration featuring a plurality of stages, wherein each stage produces an analog output.

Referring to FIG. 4 compared with FIG. 1, MIMO system 51 is implemented in n stages (51a to 51n) configuration, wherein an analog signal is passed through the series of the stages. It is to be understood that FIG. 4 is just a schematic diagram illustrating multi-stages configuration in accordance with the present invention and the hereinafter disclosed method represents only the main and important parts of the method for multi-stage constructing at least one digital input signal and providing analog representation thereof. Hereinafter disclosed method is preferably executed in parallel hardware design.

In an exemplary preferred embodiment of the generalized method and corresponding digital input signal constructor of the present invention there is feeding Digital Signal Processor (DSP) 53 with at least one digital input signal 54 and synchronization clock 56.

At least one digital input signal 54 is the digital input signal to be constructed by Digital Signal Constructor 50 as the constructed analog signal, equivalent to the digital input signal 54.

Synchronization clock 56 may be a signal featuring fixed pulse shape and frequency, or any other deterministic signal or signals featuring frequency. Synchronization clock 56 is used for timing some or all of the components of the constructor of the present invention.

There is, occasionally or within a repetitive training period, DSP 53 identifying the model of discrete output devices and MIMO stages 51a-n, referred to as constructing device 63, for creating a representation of the relationships between DSP digital outputs 55 and at least one analog output signals 59 of MIMO stages.

In an exemplary embodiment of the present invention, discrete output devices are n discrete output devices 52a-n as illustrated in FIG. 4. The identification process of the model of n discrete output devices 52a-n and MIMO stages 51a-n, referred to as constructing device 58, may be done in a similar manner to one of the above disclosed exemplary identification processes. In order to clarify, there is no need to estimate the transfer function of each one of the stages separately.

There is DSP 53 calculating n digital outputs 55a-n, according to desired input 54 such that output 59 will be an analog construction of digital input 54, by using the at least one digital input signal 54 and the identified model of constructing device 63.

One way to generate outputs 55a-n according to a desired input is by inverting the model of constructing device 63. One of the features of the multistage construction is the relative simple way of constructing a MIMO satisfying the requirements of having an inverse and having a stable and easy to do controller. For example, making stages including attenuators makes it easy to build a MIMO with decreasing gains by a ratio between 0.5 to 1 as described above.

The n digital outputs 55a-n are received by discrete output devices featuring: n digital inputs, m analog outputs, and simple conversion rules between the n digital inputs and the m analog outputs.

The discrete output devices receiving the n digital outputs 55a-n may incorporate one or more discrete output devices.

In an exemplary embodiment of the present invention, as illustrated in FIG. 4, the discrete output devices receiving the n digital inputs are made of n discrete output devices 52a-n. In an exemplary embodiment, the n discrete output devices 52a-n are low resolution digital to analog converters or a one bit digital to analog converters. In this case, the number n (of n digital inputs) is equal to m (of m analog outputs).

In an exemplary embodiment of the present invention, discrete output devices receive synchronization clock 56, used for timing.

There is a corresponding MIMO stage to each one of the discrete output devices. MIMO stages 51b-n are receiving at least one analog input signal from the preceding stage and analog signal from the appropriate discrete output device. First MIMO stage 51a is receiving only the analog signal from the appropriate discrete output device. All MIMO stages are providing at least one output analog signal. Last MIMO stage 51n is providing at least one output analog signal 59 equivalent to the digital input signal 54.

In an exemplary embodiment of the present invention, MIMO stages receive synchronization clock 56, used for timing.

As disclosed above, for each exemplary preferred embodiment, the multi-stage digital input signals constructor in accordance with the present invention has a scalability capability to increase its resolution through increasing the number of its stages. It is to be understood that even though the resolution can be unlimitedly increased, the actual resolution is limited by noise and other factors. Therefore, adding additional stages, once the maximal SNR has been achieved, does not improve the performance, unless the dynamic range needs to be increased.

The maximum achievable accuracy and speed performance of any digital input signal constructor is limited by the non-ideal effects of its building blocks. Exemplary non-ideal effects are: settling time, finite amplifier gain, and/or analog component mismatch. When designing high-speed and high-accuracy digital input signal constructor, just described non-ideal effects impose very stringent demands on the building blocks, leading to prolonged design time. Just described non-ideal effects also require the use of manufacturing processes that are optimized for component matching, thus increasing the manufacturing cost. The exemplary implementation of the first multi-stage exemplary preferred embodiment of the generalized method and corresponding digital input signal constructor of the present invention disclosed below relaxes aforementioned design-requirements.

Figure 5:
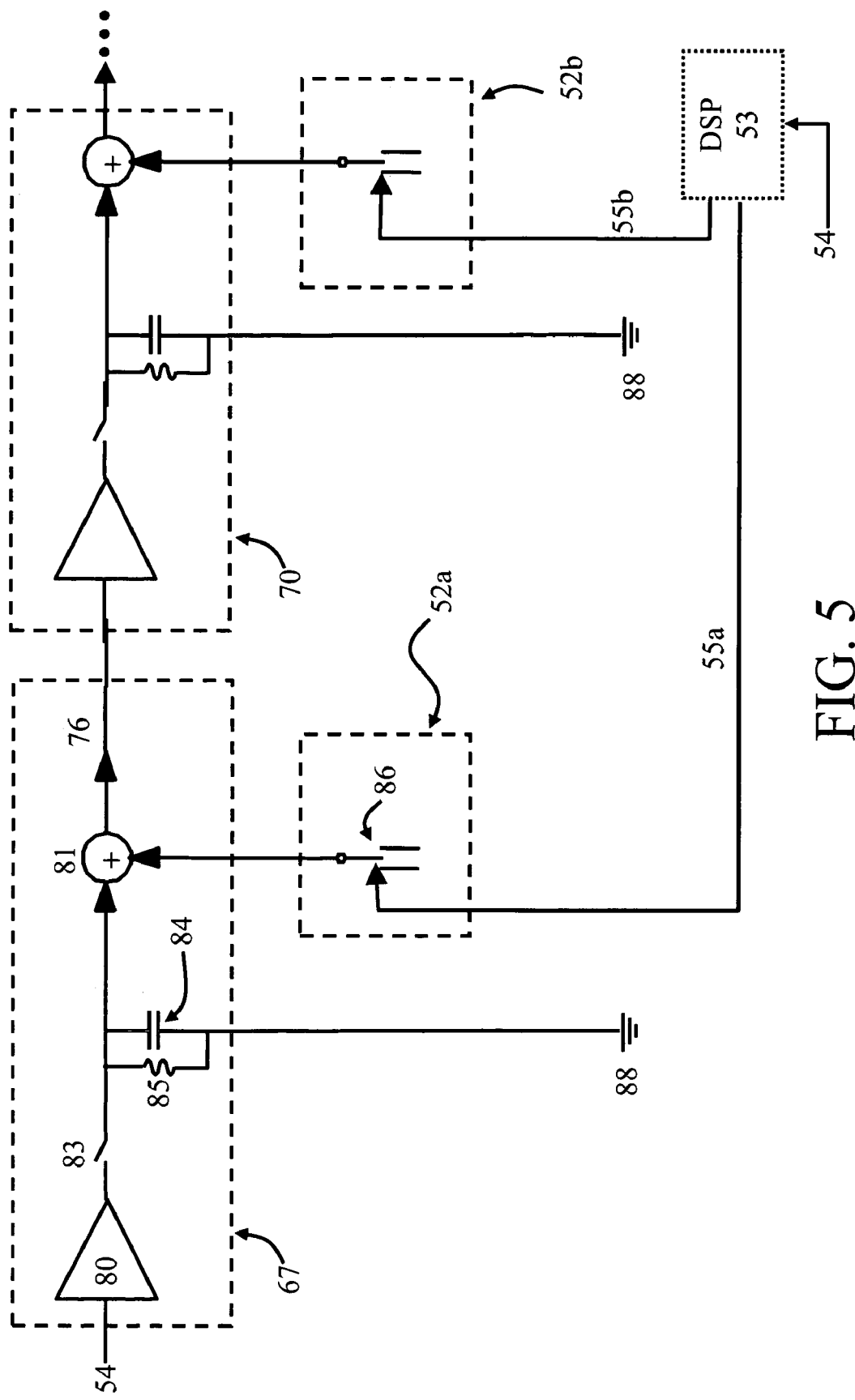
FIG. 5 is a schematic diagram illustrating an exemplary implementation of a stage, in accordance with the multi-stage exemplary preferred embodiments of the generalized method and corresponding digital input signal constructor of the present invention.

In an exemplary implementation of the multi-stage exemplary preferred embodiment of the generalized method and corresponding digital input signal constructor of the present invention, an analog signal is passed through a series of MIMO stages, wherein each stage is implemented as illustrated in FIG. 5 with reference number 67. In each MIMO stage, the signal is attenuated (with gain approximately between 0.5 to 1) and according to the DSP decision, a constant is subtracted or added to the amplified signal. FIG. 5 illustrates only two stages, but it should be understood that a better resolution is implemented with the addition of stages. In other words, it should be understood that FIG. 5 illustrate only two stages out of many more implemented in a representative exemplary digital input signals constructor device in accordance with the present invention.

In each stage, the analog input signal 54 is amplified by amplifier 80. In an exemplary embodiment of the present invention, amplifier 80 is a transconductance amplifier (converts voltage input to current output). In an exemplary embodiment of the present invention, the amplified analog signal is approximately integrated by using capacitor 84 for the duration of switch 83 is closed. Switch 83 is closed during the low portion of synchronization clock 56 (not shown in the figure). In an alternative embodiment, amplifier 80 is switched off during the high portion of synchronization clock

56 instead of using switch 83. Resistor 85 is used to discharge capacitor 84 during the time switch 83 is open. The circuit is designed such that the time constant of the capacitor discharge is not too small, since during that time constant the next stage is integrating. On the other hand, the circuit is designed such that the time constant of the capacitor discharge is not too long, so that the capacitor is mostly discharged at the end of the time constant. The residual voltage is summed with the next sample and is causing Inter Symbol Interference (ISI). This ISI is not desired but usually is not reducing the performance of the sampler since it can be modeled and corrected for in the DSP 53.

Discrete output device 52a is comparing digital outputs 55a with a threshold. Whenever the result of the comparison is positive, a constant K is subtracted at voltage adder 81 by using selector 86. Otherwise, a constant K is added at voltage adder 81.

Herein disclosed an operational example of two stages, illustrating the multi-stage digital input signal constructor operation. In that second half period of synchronization clock 56, the following stage is active. In other words, the activating timing of the amplifier of the following stage is opposite in respect to its preceding stage. During the time that the current stage is inactive, capacitor 84 is discharged close to zero to be prepared for the next sample. During that time, the amplifier of the following stage is using voltage 76 and the capacitor of the following stage is integrating. The gain of the stage is a function of the amplifier transconductance, the capacitor and resistor values, the clock duration, similar parameters of the neighboring stages and other factor related to actual implementation. The voltage gain of a signal passing through a stage is not well defined due to the change of the shape of the signal as passing through the stages. The overall gain between each input 57 to the output 59 may be approximately determined using the method outlined above for the general MISO.

In case the accuracy of the component is lower than the allowed range for the gain (usually desired to be between 0.55 to 0.65), an adaptive gain adjustment may be added to the present invention. The DSP is making gain measurements by the model or by analyzing statistics of the digital outputs 55, and is adjusting the gain. For example the DSP can change the bias current of the transconductance amplifier in order to control its gain. The gain control not have to be accurate it is only used for moving the gain into the desired range.

Figure 6:
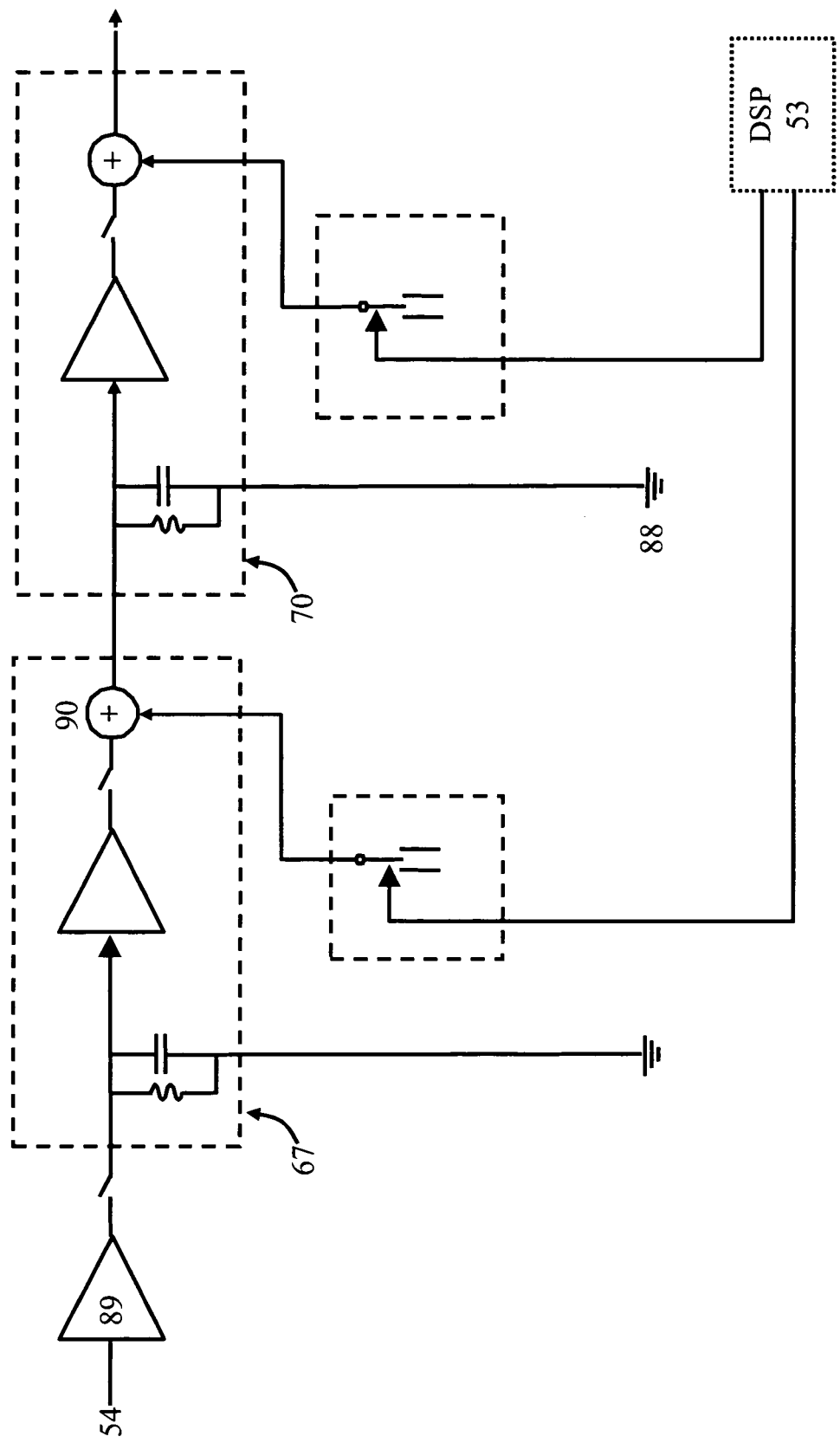
FIG. 6 is a schematic diagram illustrating an alternative exemplary implementation of a stage, in accordance with the multi-stage exemplary preferred embodiments of the generalized method and corresponding digital input signal constructor of the present invention.

In an alternative exemplary embodiment of the present invention, instead of generating and adding voltage as illustrated in FIG. 5, currents are generated and added as illustrated in FIG. 6. Currents are added directly at adder 90 and amplifier 89 is only a driving amplifier and does not belong to first MIMO stage 67. Except for the different circuit connections, the two exemplary embodiments illustrated in FIG. 5 and FIG. 6 are mathematically equivalent.

Herein described an exemplary implementation of controller 53' together with model 58' in DSP 53. Let the input at time n be x, and c the raw of C representing the current time n. The following algorithm written partly in pseudo-code can be implemented either in software or in hardware.

Repeat the following stages for each time index n:
    a) take previous vectors $v(n-M) \ldots v(n-1)$ generated by the algorithm and compute the ISI term by multiplying them by the matrix C excluding the raw representing the current time n.
    b) subtract the ISI term from the input x.
    c) initialize e=x;
    d) for i=N−1 down to 0 do
      if e>0
        e=e−c(i);
        v(n,i)=1;
      else
        e=e+c(i);
        v(n,i)=−1;
    end;
    e) output v(n)

Herein described an alternative exemplary preferred embodiment of the generalized method and corresponding digital input signal constructor of the present invention. This exemplary preferred embodiment relates to parallel constructing device. The parallel type embodiment featuring enhances performance when dealing with external parasitic noise source. The parallel type embodiment including a plurality of constructing devices, wherein in an exemplary embodiment each constructing device featuring a plurality of stages. An analog representation of the digital input signal can be obtained by combining the outputs of plurality of constructing devices and using a jointly identified model of the plurality of constructing devices, including the crosstalk between them. The redundant implementation has enough dimensionality to be able to solve for a model inverse which both minimize the error between the constructed signal and the desired signal, and the effects of the external noise sources, given that these sources are common to more than one constructing device.

In an alternative embodiment of the parallel MIMO type, the plurality of parallel digital input signal constructors are accepting at least two different digital input signals and generating correspondingly at least two analog outputs. In this parallel MIMO type embodiment, the plurality of parallel digital input signal constructors are placed on the same silicon substrate, featuring crosstalk between the plurality of constructing devices, resulting in one system requiring a common model identification. The common model identification enables eliminating the crosstalk effect or decreasing its negative influence.

Thus, it is understood from the embodiments of the invention herein described and illustrated, above, that the method and corresponding device for constructing at least one digital input signal and providing analog representation thereof, of the present invention, are novel and neither anticipated or obviously derived from the previous art.

Moreover, implementation of the present invention results in significantly increasing the throughput, reducing consumed power, and increasing resolution of known in the art digital input signal constructors.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

It is to be understood that the present invention is not limited in its application to the details of the order or sequence of functions of operation, or operations, or implementation of the method for sampling analog signals and providing digital representation thereof or to the details of construction, arrangement, and, composition of the corresponding digital input signal constructors thereof, set in the description, drawings, or examples of the present invention.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described in conjunction with specific embodiments and examples thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A method for converting at least one digital input signal to at least one analog representation signal thereof, comprising:
   (a) feeding a DSP with said at least one digital input signal and a synchronization clock,
   (b) repeatedly identifying a model of a digital to analog waveform converter for creating a representation of the relationships between said DSP digital outputs and at least one of said at least one analog representation signal, wherein said digital to analog waveform converter comprises discrete output devices and a MIMO system,
   (c) said DSP is calculating n digital outputs, by using said at least one digital input signal and the identified model of said digital to analog waveform converter,
   (d) said n digital outputs are received by k discrete output devices comprising in total: n digital inputs, m analog outputs, and simple conversion rules between said n digital inputs and said m analog outputs,
   (e) said MIMO system receiving said m analog outputs, and providing at least one output analog signal equivalent to said at least one digital input signal.

2. The method of claim 1, wherein said MIMO system comprises low accuracy components featuring high bandwidth, high gain, and low current consumption.

3. The method of claim 1, wherein said MIMO system comprises passive components.

4. The method of claim 1, further comprising clock skew.

5. The method of claim 1, wherein said MIMO system is time varying according to said synchronization clock.

6. The method of claim 1, wherein said identifying the model comprises identifying the inverse relation.

7. The method of claim 1, wherein said m analog outputs are time varying according to a predetermined waveform.

8. The method of claim 1, wherein the value of each of said m analog outputs is selected from a predefined group of values.

9. The method of claim 1, wherein said model is identified by applying an identification algorithm comprising a-priori statistical knowledge.

10. The method of claim 1, wherein said digital to analog waveform converter is enclosed in a system performing several signal processing functions which contain information regarding said at least one analog representation signal, and said information is sufficient for the step of identifying the model of the digital to analog waveform converter.

11. The method of claim 1, wherein an additional digital to analog waveform converter comprising a system model with unknown parameters is used for identifying said model of said digital to analog waveform converter, and unknown parameters of both models are identified by joint model identification algorithm.

12. The method of claim 11 where said joint model identification algorithm is based on feeding said digital to analog waveform converter with at least one known training sequence.

13. The method of claim 12, wherein said at least one known training sequence comprises an independently and identically distributed pseudo-random sequence.

14. The method of claim 1, wherein the step of identifying the model further comprises low speed components sampling said at least one analog representation signal every few samples and training only on the sampled samples.

15. The method of claim 1, wherein the step of identifying the model further comprises a low speed DAC reference, wherein a training digital signal is fed both to said low speed DAC reference and to said digital to analog waveform converter, and the analog output signals of the low speed DAC reference and said at least one analog representation signal are subtracted in order to create an error signal; said error signal is sampled and fed to said DSP for training.

16. The method of claim 1, wherein said discrete output devices comprise at least one low resolution digital to analog converter.

17. The method of claim 1, wherein said identifying the model comprises feeding at least one known digital signal to said at least one digital input signal in a training period, and reading said known digital signal and digital result from at least one analog to digital converter connected to said at least one analog representation signal, and identifying the model of said digital to analog waveform converter by applying a system identification algorithm.

18. The method of claim 17, wherein said at least one known digital signal comprises a sequence of independently and identically uniformly distributed pseudo-random numbers.

19. The method of claim 17, wherein said analog to digital converter and said digital to analog waveform converter are adaptive and trained together.

20. The method of claim 1, wherein the step of calculating the n digital outputs comprises inverting said model by using internal controller in order to keep the error to be within a deterministic or probabilistic set of predefined constraints and internal constructing device for implementing, in the digital domain, the mathematical equivalence of the transfer function of said digital to analog waveform converter.

21. The method of claim 1, wherein said MIMO system is selected from the group consisting of continuous MIMO system, MIMO system having a unified model, and continuous MIMO system having a unified model.

22. The method of claim 21, wherein said MIMO system is a linear MIMO system.

23. The method of claim 1, wherein said MIMO system is a linear MIMO system, and the step of identifying the model further comprises LMS technique.

24. A method comprising:
   (a) feeding a DSP with at least one digital input signal and synchronization clock,
   (b) occasionally or within a repetitive training period, said DSP is identifying a model of a digital to analog waveform converter wherein said digital to analog waveform converter comprises at least one discrete output device and m MIMO stages, and whereby the model represents the relationships between digital outputs of said DSP and at least one analog output signal of the m MIMO stages,
   (c) calculating n digital outputs, by using said at least one digital input signal and the identified model,
   (d) said n digital outputs are received by said at least one discrete output device comprising, in total, n digital inputs, m analog outputs, and simple conversion rules between said n digital inputs and said m analog outputs,
   (e) corresponding MIMO stage to each one of said m analog outputs, excluding first MIMO stage, are receiving at least one analog input signal from the preceding stage and the appropriate analog signal said at least one discrete output device; first MIMO stage is receiving only the appropriate analog signal from said at least one discrete output device; all m MIMO stages are providing at least one output analog signal; last MIMO stage is providing at least one output analog signal equivalent to said digital input signal.

25. The method of claim 24, wherein each of said m MIMO stages comprises attenuating the signal, and adding a predefined constant or subtracting said predefined constant from said attenuated signal, according to said DSP decision.

26. A parallel multi-stage digital to analog waveform converter, comprising:
(a) plurality of digital to analog waveform converters receiving at least two different digital input signals,
(b) said plurality of digital to analog waveform converters are placed on the same silicon substrate, featuring crosstalk between themselves,
(c) a common DSP, whereby said DSP is treating said crosstalk effect, whereby each of the plurality of the digital to analog waveform converters comprises: amplifier amplifying an input signal, integration means for integrating the amplified signal, means for adding predefined, corrections to the amplified signal, a synchronization clock.

27. A device comprising:
(a) a digital to analog waveform converter comprising: (i) at least one discrete output device and (ii) a MIMO device; said discrete output device comprising simple conversion rules between said digital inputs and said analog outputs; said discrete output device is connected to said MIMO device; and said MIMO device comprising at least one analog input and at least one analog output;
(b) a DSP connected to at least one digital input signal, a synchronization clock and at least one discrete output device, whereby said DSP, occasionally or within a repetitive training period, is identifying a model of said digital to analog waveform converter for creating a representation of the relationships between said digital outputs of said DSP and at least one of the analog output signals of said MIMO device; whereby said DSP while not in training mode is calculating the appropriate input to the at least one discrete output device using said model to provide at least one output analog signal equivalent to said digital input signal.

28. The device of claim 27, wherein said synchronization clock is a signal selected from the group consisting of fixed pulse shape and frequency, and any deterministic signal featuring frequency.

29. The device of claim 27, wherein said DSP is implemented by two separate DSPs.

30. The device of claim 27, wherein said training generator is implemented within said DSP.

31. The device of claim 27, wherein said device is enclosed in a system performing several signal processing functions which contains information regarding said at least one analog representation signal, and said information is sufficient for identifying the model.

32. The device of claim 27, further comprising an additional digital to analog waveform converter comprising a system model with unknown parameters, whereby said additional digital to analog waveform converter is used for identifying said model, and unknown parameters of both models are identified by joint model identification algorithm.

33. The device of claim 27, further comprising low speed components, whereby said low speed components are sampling said at least one output analog signal every few samples and training only on the sampled samples.

34. The device of claim 27, wherein said discrete output devices further comprising at least one low resolution digital to analog converter.

35. The device of claim 27, wherein said MIMO device is selected from the group consisting of continuous MIMO device, MIMO device having a unified model, and continuous MIMO device having a unified model.

36. The device of claim 35, wherein said MIMO device is a linear MIMO device.

37. The device of claim 27, wherein said device is implemented as a multi-stage configuration.

38. The device of claim 27, wherein said device is implemented as a multi-stage configuration and said multi-stage configuration further comprising an iterative control, whereby said iterative control is transferring a residual error to subsequent stages in each stage where the control function is successfully implemented.

39. The device of claim 27, wherein said analog representation having RMS below 10 mili volt at frequency above 10 MHz.

40. A method comprising:
(a) feeding a DSP with said at least one digital input signal and a synchronization clock,
(b) calculating, by said DSP, a digital outputs, by using said at least one digital input signal and a digital to analog waveform converter model,
(c) receiving by k discrete output devices said n digital outputs, said k discrete output devices comprising, in total, n digital inputs, m analog outputs, and simple conversion rules between said n digital inputs and said m analog outputs,
(d) receiving by a MIMO system said m analog outputs, and providing at least one output analog signal equivalent to said at least one digital input signal.

41. The method of claim 40, wherein said MIMO system can be considered as time invariant by using analog or digital compensation methods.

42. A multi-stage digital to analog waveform converter comprising stages, wherein each stage comprises:
(a) amplifier amplifying an input signal,
(b) means for approximately integrating the amplified signal,
(c) a clock for synchronizing said stage,
(d) means for adding at least one predefined correction to said amplified signal, wherein multi-stage digital to analog waveform converter further comprising digital signal processing means calculating said corrections by utilizing the relationships between the corrections and at least one of the amplified signals.

43. The device of claim 42, wherein analog output signal of said waveform converter having RMS below 10 mili volt at frequency above 10 MHz.

44. The device of claim 42, wherein said amplifier is open loop transconductance amplifier.

45. The device of claim 42, wherein said clock is modulating said amplifier.

46. The device of claim 42, wherein said digital signal processing means comprising a training generator feeding at least one known digital signal to said input digital signal in a training period, and reading said known digital signal and digital result from at least one ADC connected to said at least one analog output signal, and identifying the model of said multi-stage digital to analog waveform converter by applying a system identification algorithm.

47. The device of claim 46, wherein said training generator is implemented within said DSP.

* * * * *